(12) United States Patent
De Mey et al.

(10) Patent No.: US 6,587,531 B1
(45) Date of Patent: Jul. 1, 2003

(54) CLOCK RECOVERY CIRCUIT AND A RECEIVER HAVING A CLOCK RECOVERY CIRCUIT

(75) Inventors: Eric De Mey, Purasca (CH); Jonathan L. Watson, Zurich (CH); Brian G. Maloney, Cambridge (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/252,692

(22) Filed: Feb. 18, 1999

(30) Foreign Application Priority Data

Feb. 26, 1998 (GB) .............................................. 9804045
Sep. 24, 1998 (GB) .............................................. 9820721

(51) Int. Cl.⁷ ................................................ H03D 3/24
(52) U.S. Cl. ..................................... 375/373; 375/371
(58) Field of Search ................................ 375/354, 371, 375/355, 373, 375, 376; 326/93; 327/141, 156, 159, 291, 165; 360/51

(56) References Cited

U.S. PATENT DOCUMENTS

| | | | |
|---|---|---|---|
| 4,970,609 A | * 11/1990 | Cunningham et al. | ........ 360/51 |
| 5,134,637 A | * 7/1992 | Beyer et al. | ................. 375/357 |
| 5,418,822 A | 5/1995 | Schlachter et al. | |
| 5,502,711 A | 3/1996 | Clark et al. | ................... 369/124 |
| 5,689,533 A | * 11/1997 | Brauns et al. | ............... 375/360 |
| 5,943,378 A | * 8/1999 | Keba et al. | .................. 375/373 |
| 6,259,755 B1 | * 7/2001 | OaSullivan et al. | ......... 375/376 |

FOREIGN PATENT DOCUMENTS

WO      WO9217967      10/1992      ........... H04L/25/49

* cited by examiner

Primary Examiner—Phuong Phu
(74) Attorney, Agent, or Firm—Jack D. Slobod

(57) ABSTRACT

A data receiver comprises a receiver for receiving a data signal and providing a base band output, a demodulator coupled to an output of the receiving means receiver for providing a data output, and a clock recovery circuit coupled to an output of the demodulator for recovering symbols represented by the data output. The clock recovery circuit is operable to determine a time difference between rising and falling edges in the data output and their nominal reference points, and to determine respective clock reference points for the rising and falling edges from the time difference between the rising and falling edges.

15 Claims, 4 Drawing Sheets

CLOCK RECOVERY CIRCUIT AND A RECEIVER HAVING A CLOCK RECOVERY CIRCUIT

BACKGROUND OF THE INVENTION

1. Field of the Invention

The present invention relates to a clock recovery circuit, a receiver having the clock recovery circuit and a method of recovering a clock signal.

For convenience of description the present invention will be described with reference to a receiver.

2. Description of the Related Art

In receivers used for receiving digital signals, such as pagers and cellular and cordless telephones, received signals are demodulated, decoded and transformed into Non-Return to Zero (NRZ) data of 1 or 2 bits. In order to make the information complete and suitable to be processed, a locally generated synchronisation clock is required. A clock recovery circuit is provided for generating this synchronisation clock.

U.S. Pat. No. 5,418,822 discloses a circuit arrangement for generating a clock signal from a digital signal by evaluating signal edges of the digital signal. A first device generates a pulse at a signal edge oriented in a first direction, and a second device generates a pulse at a signal edge oriented in a second direction which is opposite to the first direction. Each of the devices has one terminal for receiving a digital signal and one output. A voltage-controlled, triggerable oscillator device has at least two trigger inputs, one control input and one output. Each of the trigger inputs is connected to the output of a respective one of the first and second devices, and the output of the oscillator device is an output for the clock signal. An integration device has an input connected to the output of the oscillator device and has an output connected to the control input of the oscillator device. The purpose of this circuit arrangement is to produce a clock signal that is synchronous in both frequency and phase with the clock signal that is fundamental to the data in the digital signal.

A disadvantage of clock recovery circuits which synchronise to the rise and fall edges is that if there are changes in the group delay of the transmitter then a relative shifting occurs between the rise and fall edges of the recovered data leading to jitter and loss of sensitivity in the generated clock signal.

SUMMARY OF THE INVENTION

An object of the present invention is to avoid loss of sensitivity in the clock recovery of a FSK signal.

According to one aspect of the present invention there is provided a receiver comprising receiving means for receiving a data signal and providing a base band output, demodulating means coupled to an output of the receiving means for providing a data output, and symbol recovery means coupled to an output of the demodulating means for recovering symbols represented by the data output, characterised in that the symbol recovery means comprises means for determining the occurrence of rising and falling edges in the data output, means for determining the differences between the occurrence of the rising and falling edges and means for utilising the differences for determining a clock reference position.

According to a second aspect of the present invention there is provided a clock recovery circuit comprising means for determining the occurrence of rising and falling edges in a data signal, means for determining the differences between the occurrence of the rising and falling edges and means for utilising the differences for determining a clock reference position.

In one embodiment of the present invention the means for determining a time difference between rising and falling edges in the data output and their nominal reference points produces a time difference signal. Additionally phase locked loop means (PLL) is provided having input means for the rising and falling edges and the time difference signal and means for calculating respective reference positions for the rise and fall edges.

By the phase locked loop means calculating the respective reference positions for the rising and falling edges, the phase locked loop means will not advance or retard for each symbol change because the rising and falling edges are close to their respective calculated reference positions. As a result jitter due to different bit length is greatly reduced without decreasing the bandwidth of the phase locked loop means. The problem of the sensitivity degradation due to a difference in the bit length is solved without changing the bandwidth of the phase locked loop means. Additionally the frequency stability requirements on the phase locked loop reference oscillator are not, stringent which permits the usage of less highly specified, cheaper crystals.

In a second embodiment of the present invention respective rising and falling edge phase locked loop means are provided for noting the occurrence of a respective edge position relative to a predetermined phase and averaging means are provided for determining a clock reference position from a circular, mean of the phases in the respective phase locked loop.

According to a third aspect of the present invention there is provided a method of recovering symbols in a data signal, comprising determining the occurrence of rising and falling edges in the data signal, determining the differences between the occurrence of the rising and falling edges, and utilising the differences for determining a clock reference position.

BRIEF DESCRIPTION OF THE DRAWINGS

The present invention will now be explained and described, by way of example, with reference to the accompanying drawings, wherein.

DETAILED DESCRIPTION OF THE PREFERRED EMBODIMENTS

Figure 1:
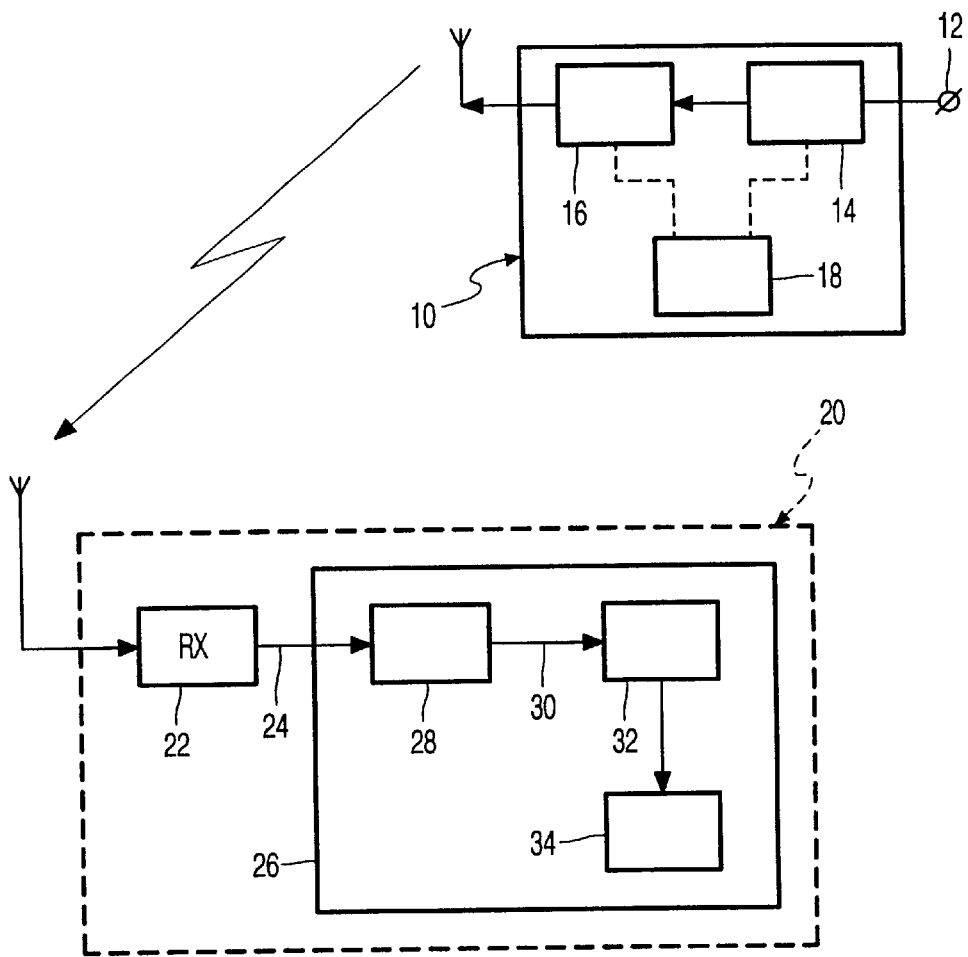
FIG. 1 is a simplified block schematic diagram of a selective call system.

The selective call system shown in FIG. 1 comprises a primary station 10 having an input 12 for paging messages to be relayed to preselected users having secondary stations 20. The paging messages are encoded and formatted in an encoder 14 and passed to a radio transmitter 16 for onward transmission as point-to-point paging signals. The operation of the primary station is controlled by a system controller 18.

The secondary station 20 comprises a receiver 22, for example a superheterodyne receiver or zero IF receiver, which frequency down converts the received signal to produce an output 24 comprising a bit sequence formed by single or pairs of bits or quadrature related I and Q signals at zero IF. The output 24 is applied to a base band stage 26 comprising a demodulator 28 which filters, decodes and transforms the output 24 into non-return to zero (NRZ) data 30 of 1 or 2 bits. A clock recovery circuit 32 generates a symbol clock signal from the NRZ data 30 and supplies the data and the symbol clock to a processor 34 in which the symbol value is derived by sampling the NRZ data 30 in the midway between the rising edge and falling edge.

Generally clock recovery relies on edge detection for synchronisation of a local clock signal with the received data, the edges corresponding to the changing of a data state. In selective call systems, such as a paging system operating in accordance with the CCIR Radiopaging Code No. 1, otherwise known as POCSAG, data corresponds to the frequencies of a frequency shift keyed (FSK) modulated radio signal.

Figure 2:
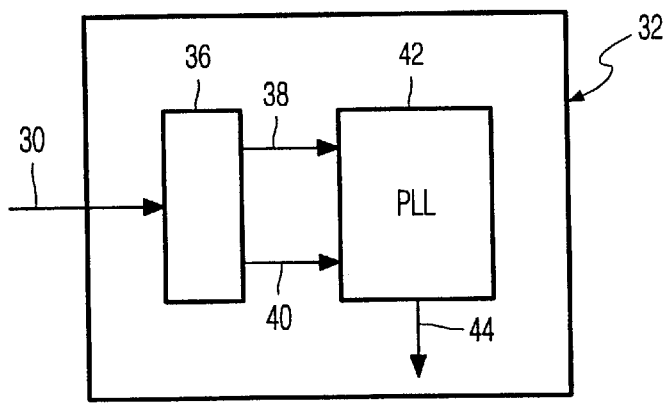
FIG. 2 is a simplified block schematic diagram of a clock recovery circuit as known in the art.

A typical clock recovery circuit 32 is shown in FIG. 2. The NRZ data 30 is applied to an edge detector 36 which provides signals 38, 40 corresponding to a rising edge or increase in the FSK frequency and to a falling edge or decrease in the FSK frequency, respectively. The rising and falling edge signals 38, 40 are applied to a PLL 42 which synchronises itself with these edge signals and produces a recovered clock signal 44, substantially midway between detected the rising and falling edges.

A weakness in this typical clock recovery circuit 32 is that due to a group delay of the FSK frequencies in the transmitter 16 of the primary station 10 and/or in the presence of co-channel signals, there is a relative shifting between the rising and falling edges and the edges of a frictive signal in which all symbols are of equal length, which edges will hereinafter be referred to as "reference points(s)". In the secondary station, the edges in the demodulated NRZ data 30 do not occur at predetermined reference points but in regions either side of the reference points. The effect of this relative shifting is to cause the PLL 42 to advance or retard for each symbol change to align it with the predetermined reference point and this results in an increase of the PLL jitter and loss of sensitivity.

Figure 3:
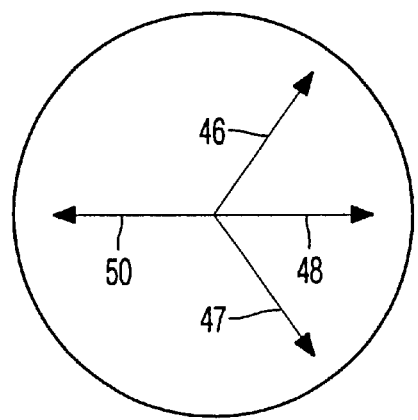
FIG. 3 is a vector diagram relating to a known type of phase locked loop (PLL)

The vector diagram shown in FIG. 3 shows the rising edges (advance) 46, the falling edges (retard) 47, the reference point 48 and the symbol clock 50 spaced 180 degrees apart from the reference point 48.

Figure 4A:
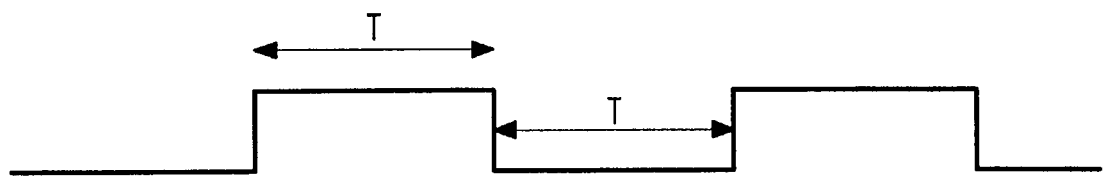
FIGS. 4A and 4B show timing diagrams of originally generated symbols and of the same symbols as received by a secondary station, respectively.
Figure 4B:
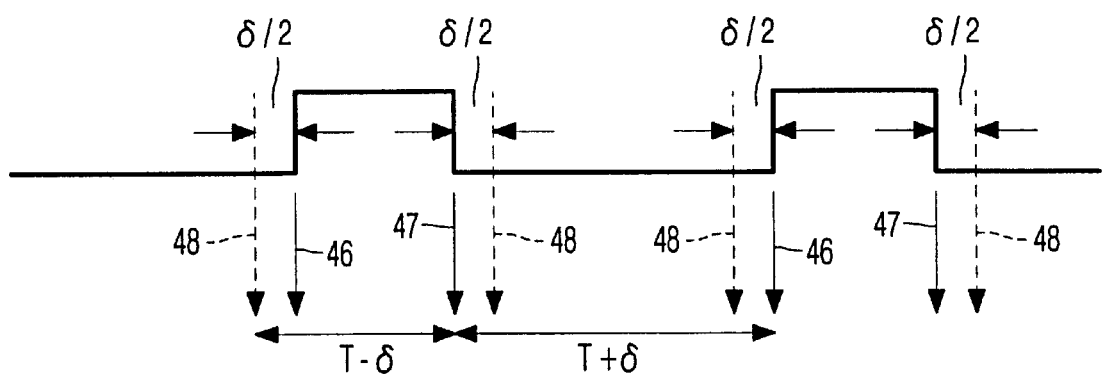

FIG. 4A illustrates the original, uncorrupted NRZ data with each pulse having a nominal symbol period T seconds. FIG. 4B illustrates the effect of group delay on the symbols such that the positive pulses are shorter by δ seconds than the period T, where δ is the time difference between the received symbol period and the ideal period T, whilst the negative pulses are longer by δ seconds than the period T. Nevertheless the rising and falling edges 46, 47 (or falling and rising edges) of the respective pulses are symmetrically disposed relative to the ideal period indicated by the reference points 48 and a time period of δ/2 exists between the edge of the ideal period and the adjacent rising or falling edge. In accordance with the present invention the, recovered clock can be generated from knowing at least the occurrence of the rising and falling edges.

Figure 5:
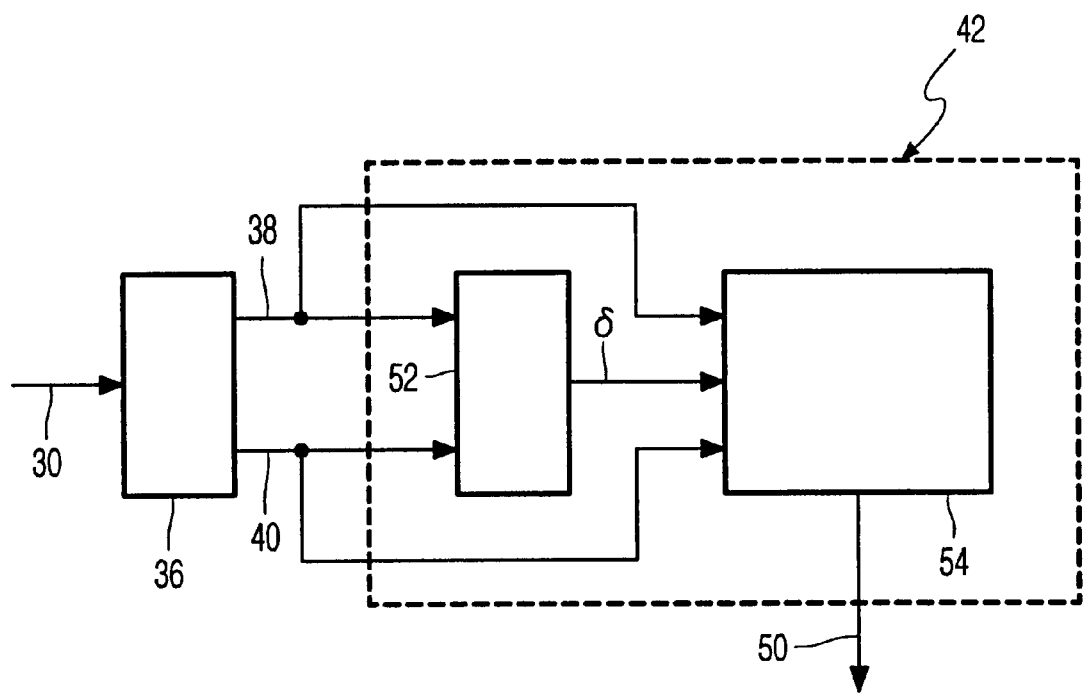
FIG. 5 is a simplified block schematic diagram of a clock recovery circuit for use in a receiver made in accordance with the present invention.

Referring to FIG. 5, data 30 from the demodulator 28 (FIG. 1) is applied to an edge detector 36 which produces rising edge signals 38 and falling edge signals 40 which are applied to a front end 52 of a PLL 42 in which the value of δ is determined. The value is determined in an adaptive way by measuring the time between the rising and falling edges or vice versa. A proper integration constant enables variation of δ due to noise to be limited whilst at the same time permitting δ to be determined quickly enough not to miss data during synchronization. In an embodiment of the present invention, the PLL front end 52 is a state machine which filters any noise close to the edges and calculates the midpoints between the edges.

A back end 54 of the PLL 42 receives not only the data edges 308, 40 but also δ and on the basis of δ, the back end 54 calculates a reference position for the rising edges and another reference position for the falling edges. As a result of calculating these reference positions, the PLL 42 will not advance or retard for each symbol change because the active rising and falling edges are close to the respective calculated reference positions.

Figure 6:
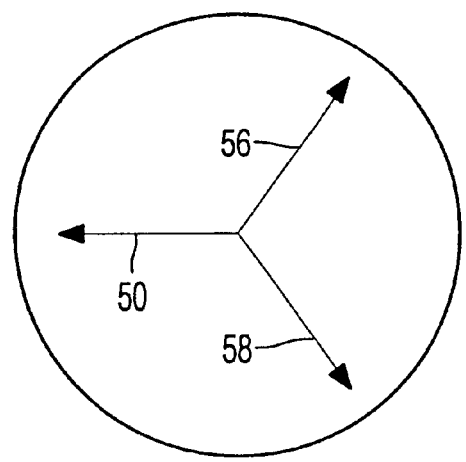
FIG. 6 is a vector diagram of a substantially jitter free PLL.

FIG. 6 illustrates a vector diagram of a substantially jitter free PLL. The rising reference points (+δ/2) 56 and the falling reference points (−δ/2) 58 are disposed in the right hand half of the diagram and the recovered clock 50 is disposed in the left hand half of the diagram, symmetrically of the reference points 56, 58.

Having regard to FIG. 5, the PLL 42 will advance only when an edge occurs after its reference position and will retard when an edge occurs before its reference position.

The circuit arrangement shown in FIG. 5 enables jitter due to different symbol length to be greatly reduced without decreasing the bandwidth of the PLL. The lock time can be maintained fast not to miss synchronisation. Finally the requirement on the PLL reference oscillator is not stringent allowing the usage of cheaper crystals having a less stringent specification.

Figure 7:
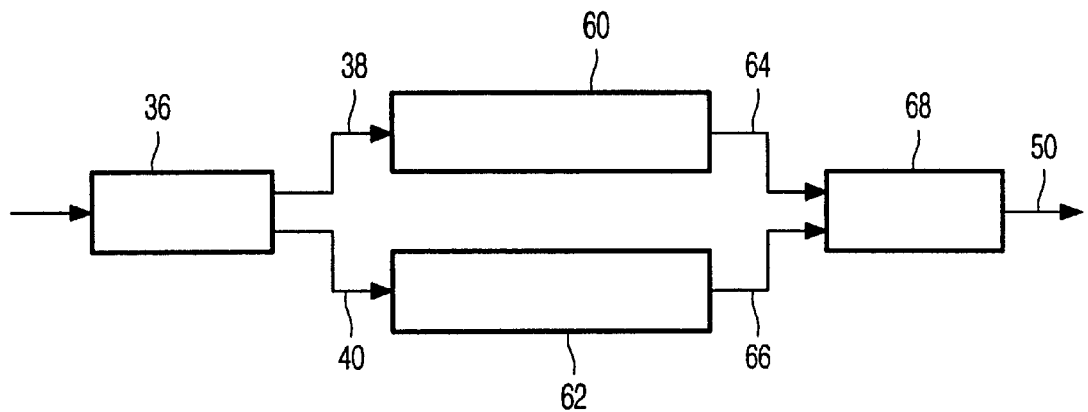
FIG. 7 is a block schematic diagram of another embodiment of the present invention.

The embodiment of the invention illustrated in FIG. 7 comprises an edge detector 36 which detects edges in the NRZ signal. The edge detector 36 generates a signal indicating a falling edge on an output 38 and a signal indicating a rising edge on an output 40. The outputs 38 and 40 are respectively connected to phase locked loops 60, 62. The phased locked loops 60, 62 are advanced respectively to align with the rising edge indication on the output 38 and with the falling edge indication on the output 40. The phases 64, 66 of the rising edge PLL 60 and the falling edge PLL 62, respectively, are fed into a clock indicator 68 which calculate the mean phase of the PLLs and indicates a recovered clock when the mean of the phases is 180 degrees out of phase with respect to the reference points.

Figure 8:
FIG. 8 illustrates a short symbol having errors δ/2 on its rising and falling edges.

In operation when the rising edges lead the falling edges, the phases of the PLLs 60 and 62 will respectively have an offset of δ/2 and −δ/2 with respect to the reference points, as shown in FIG. 8. Conversely, when the falling edges lead the rising edges, the phases of the PLLs 60, 62 will respectively have an offset of δ/2 and −δ/2 with respect to the reference points. By determining the mean of these two phases in the clock indicator 68, the centre of the symbol will be accurately indicated with no error on an output 50.

Figure 9:
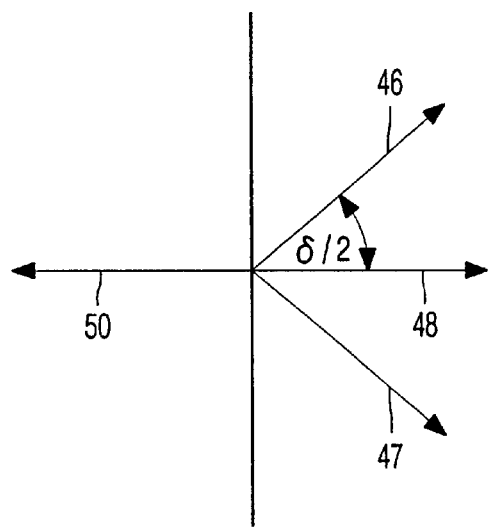
FIG. 9 illustrates one method of averaging the current phases of the PLLs in FIG. 7 and generating the recovered clock.

The point at which the minimum circular mean of the phases 64 and 66 is 180 degrees out of phase with respect to the reference points can be calculated in a straight forward manner Referring to FIG. 9, the vectors 46 and 47 illustrate the phase values 64 and 66. If both PLLs 60 and 62 are configured such that 180 degrees indicates the point at which respective edges occur, and angles are expressed in the range (−180 degrees to 180 degrees), the recovered clock 50 should be indicated when the mean of phases is 0 degrees, i.e. when the output of PLL 60 equals minus the output of PLL 62 and both counters are in the range (−90 degrees to 90 degrees).

From reading the present disclosure, other modifications will be apparent to persons skilled in the art. Such modifications may involve other features which are already known in the design, manufacture and use of receivers and component parts thereof and which may be used instead of or in addition to features already described herein.

What is claimed is:

1. A receiver, comprising:
   receiving means for receiving a data signal and providing a base band output;
   demodulating means coupled to an output of the receiving means for providing a data output; and
   symbol recovery means coupled to an output of the demodulating means for recovering symbols represented by the data output,
   wherein said symbol recovery means includes
     edge determination means for determining one or more occurrences of rising and falling edges in the data output,
     difference determination means for determining one or more differences between the one or more occurrences of rising and falling edges, and
     phase locked loop means for utilizing the one or more differences for determining a clock reference position.

2. The receiver as claimed in claim 1, wherein
   said difference determining means includes time difference means for determining a time difference between rising and falling edges in the data output and their nominal reference points for producing a time difference signal, and
   said phase locked loop means is providing having input means for the rising and falling edges and the time difference signal, and means for calculating respective reference positions for the rising and falling edges.

3. The receiver as claimed in claim 2, wherein said time difference determining means is adapted to filter-out noise edge close to the rising and failing edges.

4. The receiver as claimed in claim 2, wherein said phase locked loop means has means for calculating a clock reference intermediate the respective reference positions for the rising and falling edges.

5. The receiver as claimed in claim 1, wherein
   said edge determination means includes rising and falling edge phase locked loop means for determining the one or more occurrences of a respective rising and failing edge positions; and
   said phase locked loop means includes means for determining the clock reference position from a minimum circular mean of phases in said rising and falling edge phase locked loop means.

6. A clock recovery circuit, comprising:
   edge determination means for determining one or more occurrences of rising and falling edges in a data signal,
   difference determination means for determining one or more differences between the one or more occurrences of rising and falling edges, and
   phase locked loop means for utilizing the differences for determining a clock reference position.

7. The circuit as claimed in claim 6, wherein
   said difference determining means includes time difference means for determining a time difference between rising and falling edges in the data signal and their nominal reference points for producing a time difference signal, and
   said phase locked loop means is provided having input means for the rising and falling edges and the time difference signal, and means for calculating respective reference positions for the rising and falling edges.

8. The circuit as claimed in claim 6, wherein
   said edge determination means includes rising and falling edge phase locked loop means for determining the one or more occurrences of a respective rising and failing edge positions; and
   said phase locked loop means includes means for determining the clock reference position from a minimum circular mean of phases in said rising and falling edge phase locked loop means.

9. A method of recovering symbols in a data signal, comprising:
   determining one or more occurrences of rising and falling edges in the data signal,
   determining one or more differences between the one or more occurrences of rising and falling edges, and
   utilizing the differences for determining a clock reference position.

10. The method as claimed in claim 9, wherein
    a determination of the one or more differences between the one or more occurrences of rising and falling edges includes an operation of a phase locked loop for determining a time difference between rising and falling edges in the data signal and their nominal reference points for producing a time difference signal, and
    a utilization of the one or more differences for determining a clock reference position includes an operation of the phase locked loop for calculating respective reference positions for the rising and falling edges from the time difference and the rising and falling edges.

11. The method as claimed in claim 9, wherein
    the one or more occurrences of a respective rising and falling edge positions are determined by a respective pair of phase locked loops, and
    the clock reference position is determined from a minimum circular mean of phases in the pair of phase locked loops.

12. A receiver, comprising:
    a demodulator operable to provide a data signal; and
    a clock recovery circuit,
    wherein said clock recovery circuit is operable to determine one or more occurrences of rising and falling edges in the data signal,
    wherein said clock recovery circuit is further operable to determine one or more differences between the one or more occurrences of rising and falling edges, and
    wherein said clock recovery circuit is further operable to determine a clock reference position based upon the one or more differences between the one or more occurrences of rising and falling edges.

13. A receiver, comprising:

receiving means for receiving a data signal and providing a base band output;

demodulating means coupled to an output of the receiving means for providing a data output; and symbol recovery means coupled to an output of the demodulating means for recovering symbols represented by the data output, wherein said symbol recovery means includes rising and falling edge phase locked loop means for determining one or more occurrences of rising and falling edges in the data output, and phase locked loop means for determining a clock reference position from a minimum circular mean of phases in said rising and falling edge phase locked loop means.

14. A clock recovery circuit, comprising:

rising and falling edge phase locked loop means for determining one or more occurrences of rising and falling edges in the data output, and phase locked loop means for determining a clock reference position from a minimum circular mean of phases in said rising and falling edge phase locked loop means.

15. A method of recovering symbols in a data signal, comprising:

operating a pair of phased locked loops to determine one or more occurrences of rising and falling edges in the data signal; and determining a clock reference position from a minimum circular mean of phases in the pair of phase locked loops.

* * * * *